United States Patent [19]

Kohno

[11] Patent Number: 5,528,544
[45] Date of Patent: Jun. 18, 1996

[54] SEMICONDUCTOR MEMORY DEVICE HAVING HIGH SPEED SENSE AMPLIFIER

[75] Inventor: Takaki Kohno, Tokyo, Japan

[73] Assignee: NEC Corporation, Tokyo, Japan

[21] Appl. No.: 351,642

[22] Filed: Dec. 7, 1994

[30] Foreign Application Priority Data

Dec. 14, 1993 [JP] Japan .................. 5-312415

[51] Int. Cl.⁶ .................................... G11C 7/02
[52] U.S. Cl. .................... 365/207; 365/208; 327/52
[58] Field of Search ..................... 365/207, 208, 365/205, 203; 327/52, 53, 56

[56] References Cited

U.S. PATENT DOCUMENTS

| | | | |
|---|---|---|---|
| 5,029,138 | 7/1991 | Iwashita | 365/208 |
| 5,056,063 | 10/1991 | Santin et al. | 365/208 |
| 5,198,997 | 3/1993 | Arakawa | 365/208 X |
| 5,206,552 | 4/1993 | Iwashita | 365/208 X |

FOREIGN PATENT DOCUMENTS

| | | | |
|---|---|---|---|
| 57-50390 | 3/1982 | Japan . | |
| 58-161197 | 9/1983 | Japan | 365/208 |

*Primary Examiner*—Joseph A. Popek
*Attorney, Agent, or Firm*—Sughrue, Mion, Zinn, Macpeak & Seas

[57] ABSTRACT

Disclosed herein is a semiconductor memory device comprising an N-channel transistor and a P-channel transistor Q33 which are provided in parallel between a sense node and a power supply line, The N-channel transistor has a threshold value of near 0 V and a specified current drive capability. The P-channel transistor Q33 charges the sense node up to the level that is smaller than a power supply voltage by a threshold value thereof and the level at the sense node is then changed by use of the N-channel transistor in accordance with data stored in the memory cell coupled to the sense node.

9 Claims, 10 Drawing Sheets

SEMICONDUCTOR MEMORY DEVICE HAVING HIGH SPEED SENSE AMPLIFIER

BACKGROUND OF THE INVENTION

1. Field of the Invention

The present invention relates to a semiconductor memory device and, more particularly, to an improvement in a sense amplifier for a non-volatile memory device such as a mask ROM (Read Only Memory) and a PROM (Programmable Read Only Memory).

2. Description of the Prior Art

Figure 5:
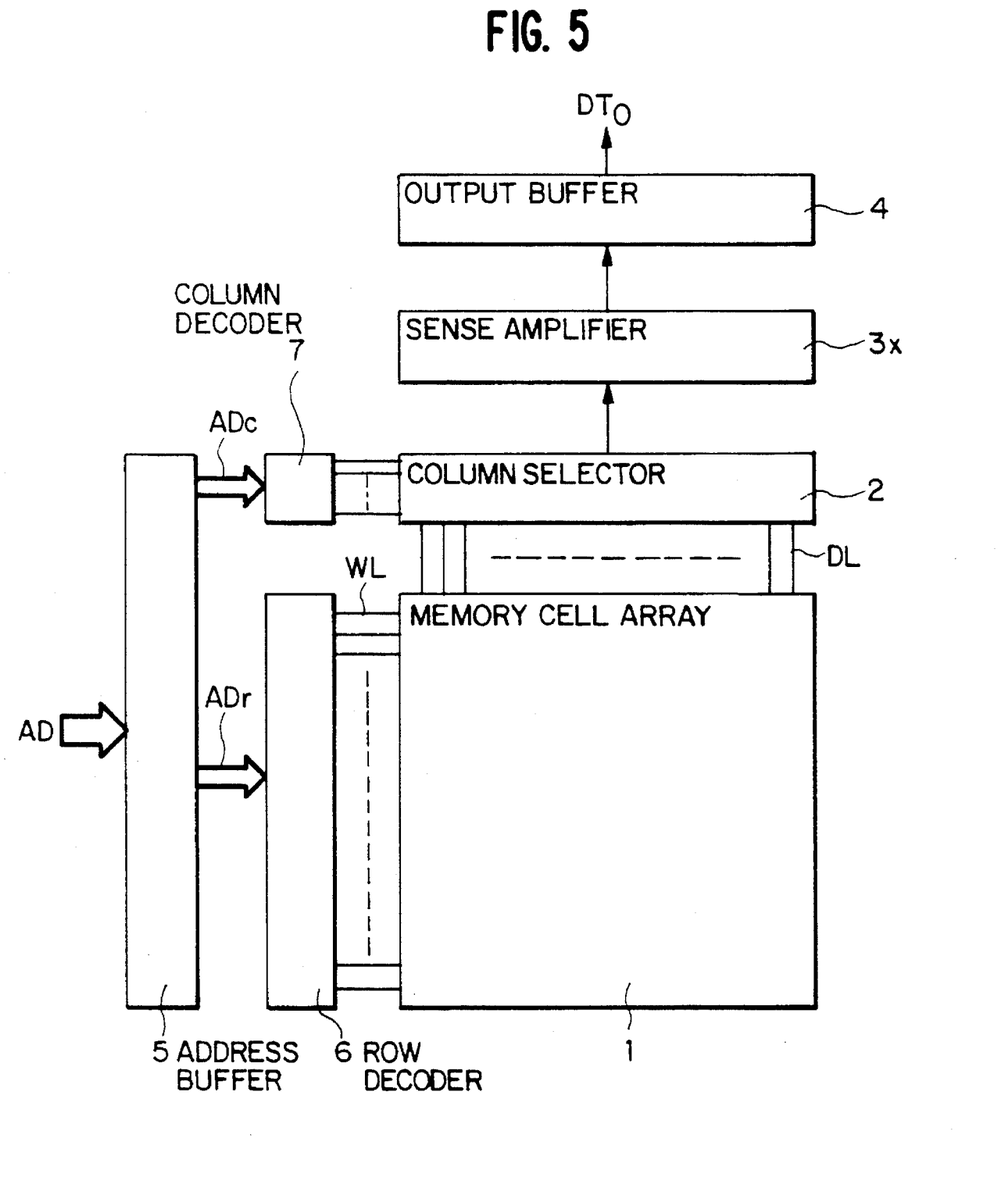
FIG. 5 is a block diagram of an example of a semiconductor memory device.

A non-volatile semiconductor memory device has in general such a block constitution as shown in FIG. 5. More specifically, this device comprises a memory cell array 1 including a plurality of memory cells (not shown) arranged in a matrix of rows and columns, a plurality of word lines WL provided correspondingly of the rows of the array 1 and a plurality of digit lines DL provided correspondingly to the columns of the array 1. A set of address signals AD is supplied to and thus held by an address buffer 5. In response thereto, the buffer 5 outputs internal row address signal ADr and an internal column address signal ADc. The row address signal ADr is supplied to a row selector 6 which then selects and energizes one of the word lines WL. On the other hand, the column address ADc is supplied to a column decoder 7 which then commands a column selector 2 to select one of the digit lines DL. Thus, one of the memory cells coupled to the selected word and digit lines is selected and designated. The memory cell thus selected transfers data stored therein to a sense amplifier 3x. Thus, an output data DTo responsive to the data stored in the selected memory cell is read out through an output buffer circuit 4.

Figure 6:
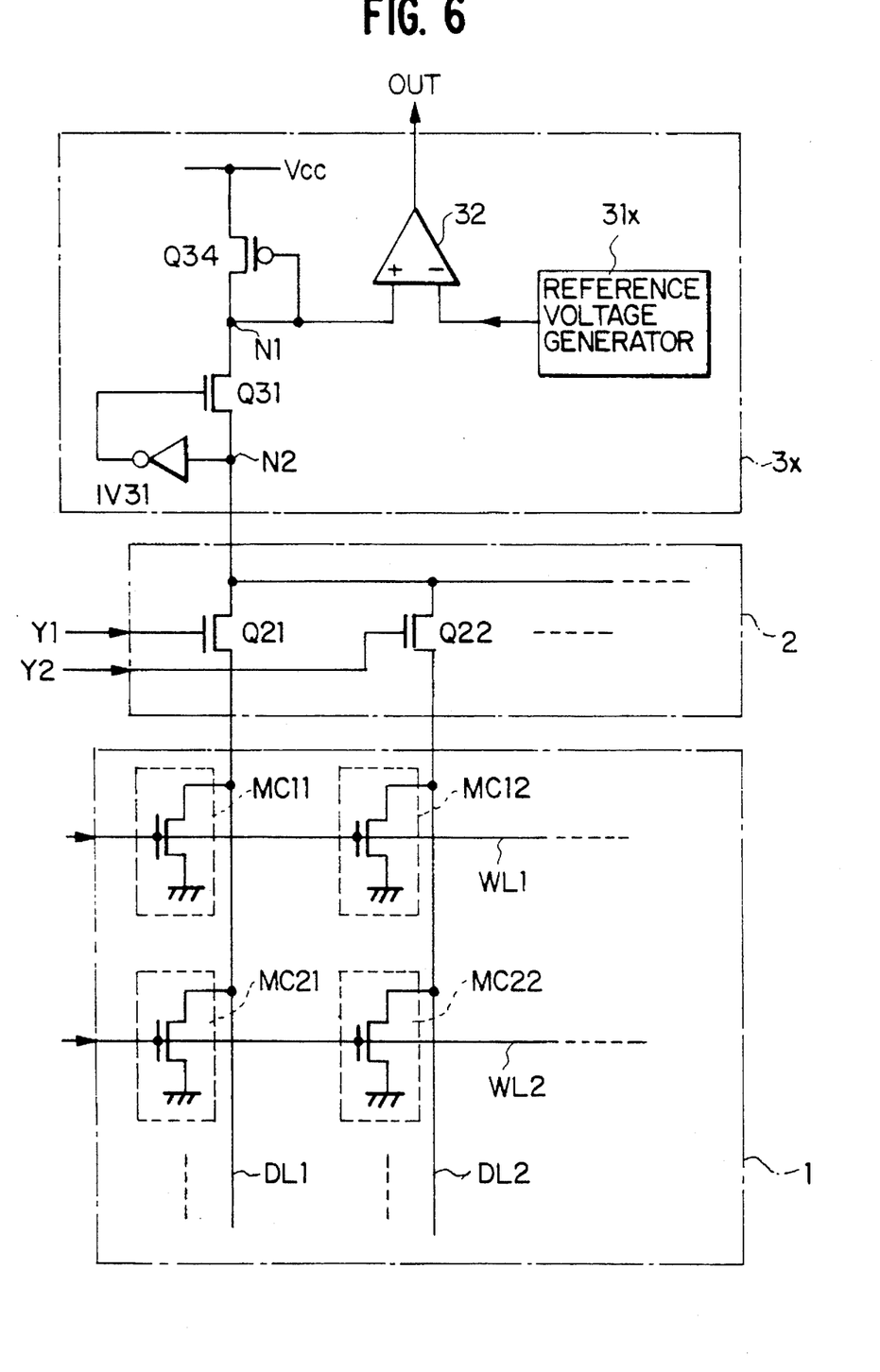
FIG. 6 is a block diagram showing parts of the memory cell array, the column selector, and the sense amplifier of the semiconductor memory device shown in FIG. 5.

Referring to FIG. 6, there are shown in detail respective parts of the memory cell array 1 and the column selector 2 and the sense amplifier 3x. As shown in FIG. 6, each of the cell arrays MC11 to MC22 is composed of a MOS transistor. This transistor stores data "1" by having a first or high threshold value $V_{TH}$ and data "0" by having a second or low threshold value $V_{TL}$ that is lower than the first threshold value $V_{TH}$.

The column selector 2 includes a plurality of N-channel MOS transistors Q21, Q22, . . . having gates supplied with column selection signals Y1, Y2, . . . from the column decoder 7 and coupled to an input node N2 of the sense amplifier 3x, and the digit lines DL1, DL2, . . . , respectively.

The sense amplifier 3x includes an inverting amplifier IV31 having an input terminal connected to the input mode N2, an N-channel enhancement-mode transistor Q31 having its source connected to the input terminal of the inverting amplifier IV31 and its gate connected to the output terminal of the inverting amplifier IV31, a P-channel transistor Q34 functioning as a load and having its source connected to a power supply line Vcc and its gate and drain connected to the drain of transistor Q31, a reference voltage generator 31x for generating a reference voltage VRx, and a differential amplifier 32 for comparing a voltage at a node N1 indicative of the drain connection of transistors Q31 and Q34 and the reference voltage VRx and outputting the comparison result OUT.

In operation, assume that the low threshold value $V_{TL}$ of the memory cell transistor is 1 V and the high threshold voltage $V_{TH}$ thereof is 7 V, for example. The threshold value of each of column selection transistors Q21, Q22, . . . is almost the same as $V_{TL}$. Also assume that the address signal AD causes the word line WL1 and digit line DL1 to be selected. The transistor Q21 is thereby rendered conductive by the column selection signal Y1 taking a selective level of 5 V (selection level). The remaining column selection signals (Y2, . . . ) take a non-selection level of 0 V. Thus, the input node N2 of sense amplifier 3x is connected to the digit line PL1.

On the other hand, the word line WL1 is energized to a selection level of 5 V and the remaining word lines (WL2, . . . ) to a non-selection level of 0 V. The memory cell transistor MC11 is thus selected.

If the memory cell MC11 stores data "1" to have the high threshold value, it is maintained to be non-conductive. The digit line DL1 is thereby charged through the transistors Q31 and Q34 up to a logic high level. If, on the other hand, the memory cell MC11 stores data "0" to have the low threshold value, it is rendered conductive, so that the digit line DL1 is discharged to a logic low level. Thus, the voltage on the digit line DL changes according to the data stored in the selected memory cell.

Figure 7:
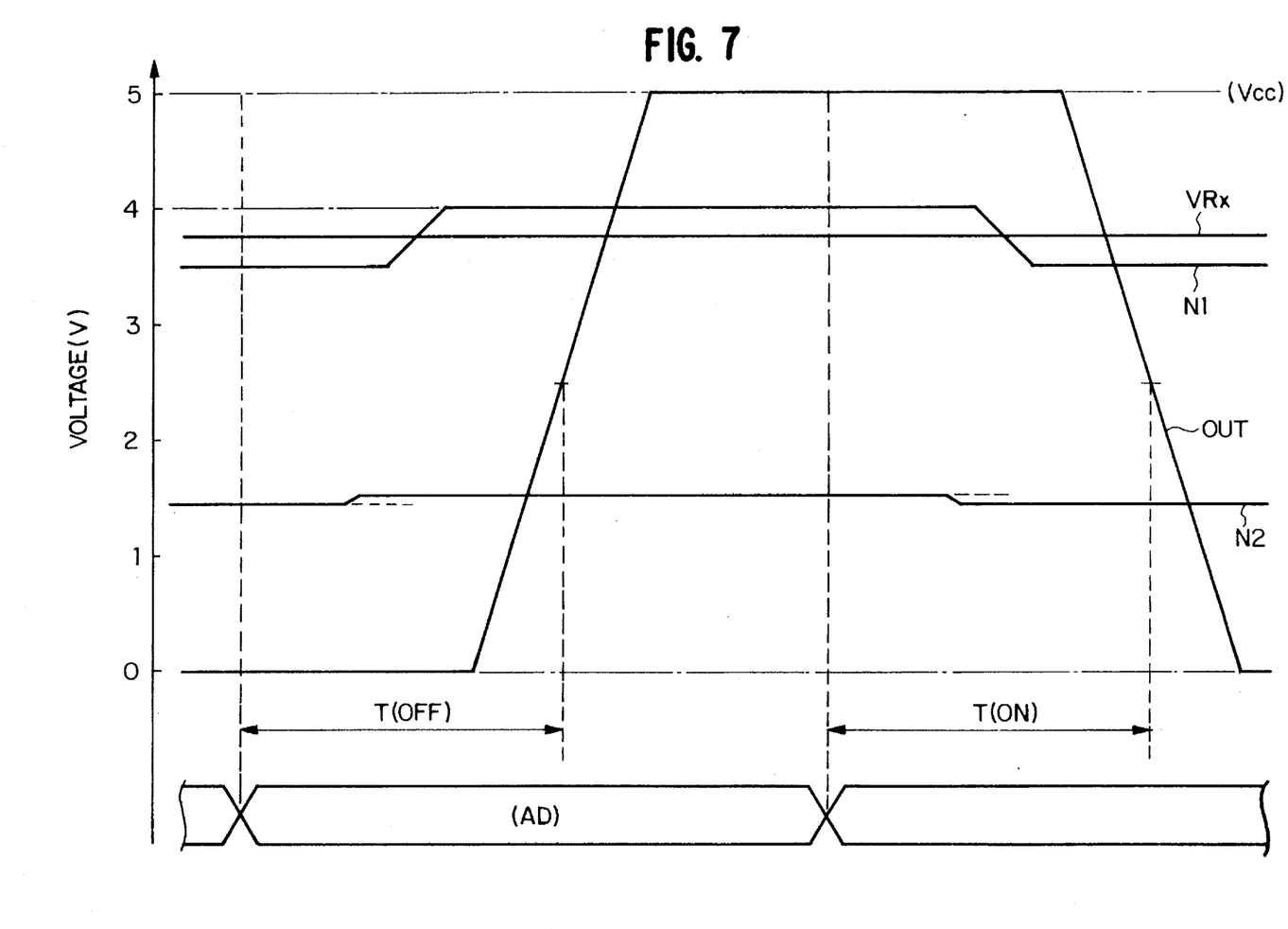
FIG. 7 is a waveform diagram used to explain how the device shown in FIGS. 5 and 6 operates.

The operation of the sense amplifier 3x will be described below with reference to the waveform diagram of FIG. 7. The selected memory cell that is in the non-conductive state is referred to as an off-bit, whereas the selected memory cell in the conductive state is referred to as an on-bit. Also, the balanced values of voltages obtained at the off-bit selection time and at the on-bit selection time are written as $V_{N1}(OFF)$ and $V_{N1}(ON)$, if they are obtained at node N1.

Incidentally, it has been stated that a voltage on the selected digit line DL changes according to the data stored in the selected memory cell. It is now assumed that $V_{N2}=V_{DL1}$, and the changes in the voltages on nodes N2 and N1 will be described with numerical values.

Node N2 is biassed near the logic threshold voltage (about 1.5 V) of inverting amplifier IV31 and, for example, $V_{N2}(OFF)$–1.50 V and $V_{N2}(ON=1.45$ V.

Since the memory cell MC is required to be small to provide a high integration density, the channel width thereof has to be designed to be very narrow, so that the current drive capability thereof must be very small. For example, the current value of the memory cell is about several μA. In contrast, the current value of each of the transistors used in the decoders 6 and 7 and the like is several 10 mA.

As a result, the difference in voltage between $V_{N2}(OFF)$ and $V_{N2}(ON)$ is only about 50 mA and therefore the following measures are adopted to amplify the amplitude of the CMOS level (5 V for high level and 0 V for low level) quickly:

Inverting amplifier IV31 and transistor Q31 are built with feedback circuits. If, on the one hand, it is now assumed that the memory cell in the selection state is switched from the on-bit to the off-bit, node N2 will go to a logic high level and the output of inverting amplifier IV31 will go to a logic low level. Consequently, node N1 can be quickly charged up to $V_{N1}(OFF)=4$ V by means of transistor Q31 being electrically disconnected.

If, on the other hand, the memory cell in the selection state is switched from the off-bit to the on-bit, node N2 goes to a logic low level and the output of inverting amplifier IV31 goes to a logic high level. Consequently, node N1 can be quickly discharged up to $V_{N1}(ON)=3.5$ V by means of transistor Q31 being electrically connected.

At this point, the voltage difference between $V_{N1}(OFF)$ and $V_{N1}(ON)$ is amplified to 0.5 V, and further, an amplitude of a CMOS level can also be obtained in the differential amplifier 32 by comparing the voltage at node N1 and reference voltage VRx and amplifying the difference therebetween.

Figure 8:
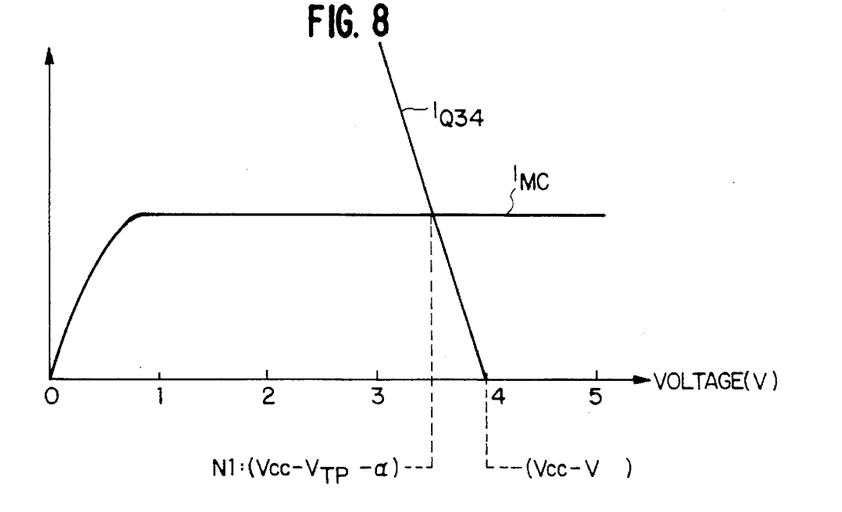
FIG. 8 is a current-vs-voltage characteristic diagram used to explain how the device shown in FIGS. 5 and 6 operates.

The set values of $V_{N1}$(OFF), $V_{N1}$(ON), and VRx will be described next in reference to the current-voltage characteristic in FIG. 8.

In the figure, $I_{MC}$ is a current that flows through a memory cell in its selected state, $I_{Q34}$ is a current that flows through the load transistor Q34, and $V_{TP}$ is the threshold value of the transistor Q34. $V_{TP}$ and $V_{CC}$ are 1 V and 5 V, respectively. Since a current does not flow through the memory cell when it is in the off-bit selection state, the following equation is obtained:

$$V_{N1}(OFF)=V_{CC}-V_{TP} \quad (1)$$

From the above equation (1), there is obtained $V_{N1}$(OFF)=5 V−1 V=4 V. On the other hand, since the memory cell current flows when the memory cell is in the on-bit selection state, the voltage, as $I_{Q34}$ and $I_{MC}$ cross each other, becomes $V_{N1}$(ON).

The $V_{N1}$(ON) can be expressed as follows:

$$V_{N1}(ON)=V_{CC}-V_{TP}-\alpha \quad (2)$$

where α is a value determined by the magnitudes of $I_{Q34}$ and $I_{MC}$. From the standpoint of design, α is preferably to be set to about 0.5 V. From equation (2), there is obtained $V_{N1}$(ON)=5 V−1 V−0.5 V=3.5 V.

Also, $VR_x$ is normally set as follows:

$$VR_x=(V_{N1}(OFF)+V_{N1}(ON))/2 \quad (3)$$

From equation (3), there is obtained $VR_x$=(4 V+3.5 V)/2= 3.75 V.

The inverting velocity of the sense amplifier will be described next. The inverting velocities (times) at the off-bit selection time and the on-bit selection time are shown as T(OFF) and T(ON), respectively. Each of these times is the time between the time that an address is switched and the time that the sense amplifier output is inverted.

The operation of the conventional semiconductor memory device has been described on the assumption that node N2 is always biased near the logic threshold value of inverting amplifier IV31.

However, in the actual semiconductor memory device, some of the nonselected digit lines balance with the ground potential level. This is because memory cell MC12 selected in the word line WL1 is electrically connected and therefore the nonselected digit line as such DL2 is discharged. Therefore, when switching of the digit lines was performed at the time of the switching of addresses, the voltage at node N2 is dropped to or near to the ground potential level.

Figure 9:
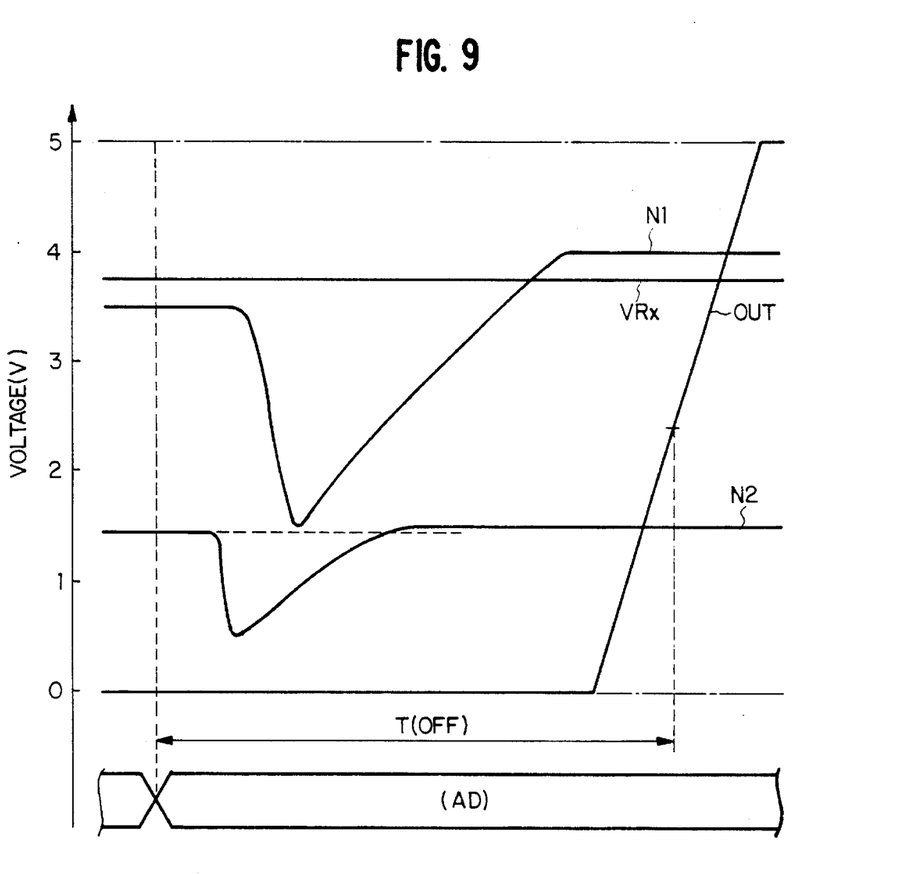
FIG. 9 is a waveform diagram used to explain the operation and problems of the devide shown in FIGS. 5 and 6.

The voltage at node N1 follows the voltage drop on node N2. Consequently, the time it takes for node N2 to recover to $V_{N2}$(ON) deteriorates the inverting velocity. This state is shown in the waveform diagram in FIG. 9.

In order to overcome the deterioration in the inverting velocity, there is an example in which the following measures are adopted.

Figure 10:
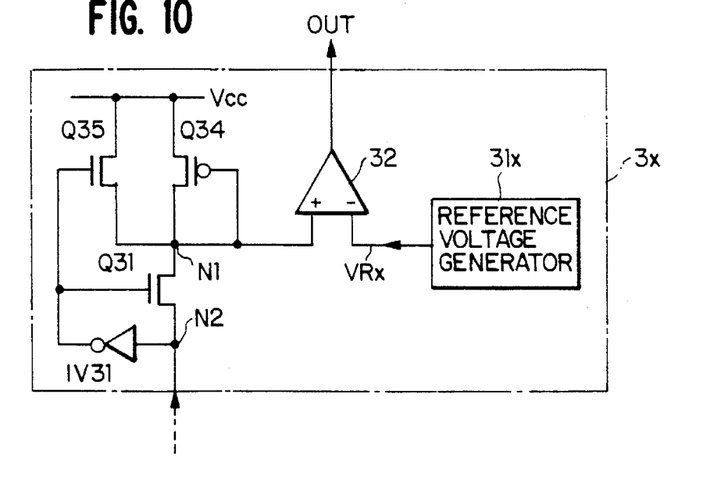
FIG. 10 is a block diagram showing a sense amplifier of another conventional semiconductor memory device.

FIG. 10 shows the sense amplifier of a semiconductor storage device (second example) in which the measures for overcoming the deterioration in the inverting velocity have been adopted.

Sense amplifier 3y is different from the sense amplifier 3x shown in FIG. 6 in that a transistor Q35 is provided for use as a precharge transistor. This transistor Q35 has its source connected to the node N1, its gate connected to the output of inverting amplifier IV31, and its drain connected to power supply line $V_{CC}$. The threshold value $V_{TN}$ of transistor Q35 depends upon the so-called back bias effect and thus has a relatively high value of 2.5 V. Therefore, even if the output of inverting amplifier IV31 were 5 V, it would not be electrically connected unless node N1 is less than $V_{CC}-V_{TN}$=2.5 V. In other words, the transistor Q35 can charge node N1 up to 2.5 V when the voltage on node N1 drops at the time of the switching of digit lines. Since the transistor Q35 is larger in current drive capability than the transistor Q34 and can be set to about ten times as large as the transistor Q34, the recovery of node N2 to $V_{N2}$(ON) can be made quickly due to the existance of the transistor Q35.

If the current drive capability of the load transistor Q34 is set to be large, there will arise the question of whether the precharge transistor Q35 is dispensable. However, setting a large current drive capability of the transistor Q34 is not preferable, because the value of α in equation (2) becomes small and therefore the stability of the operation of differential amplifier 32 is deteriorated.

Figure 11:
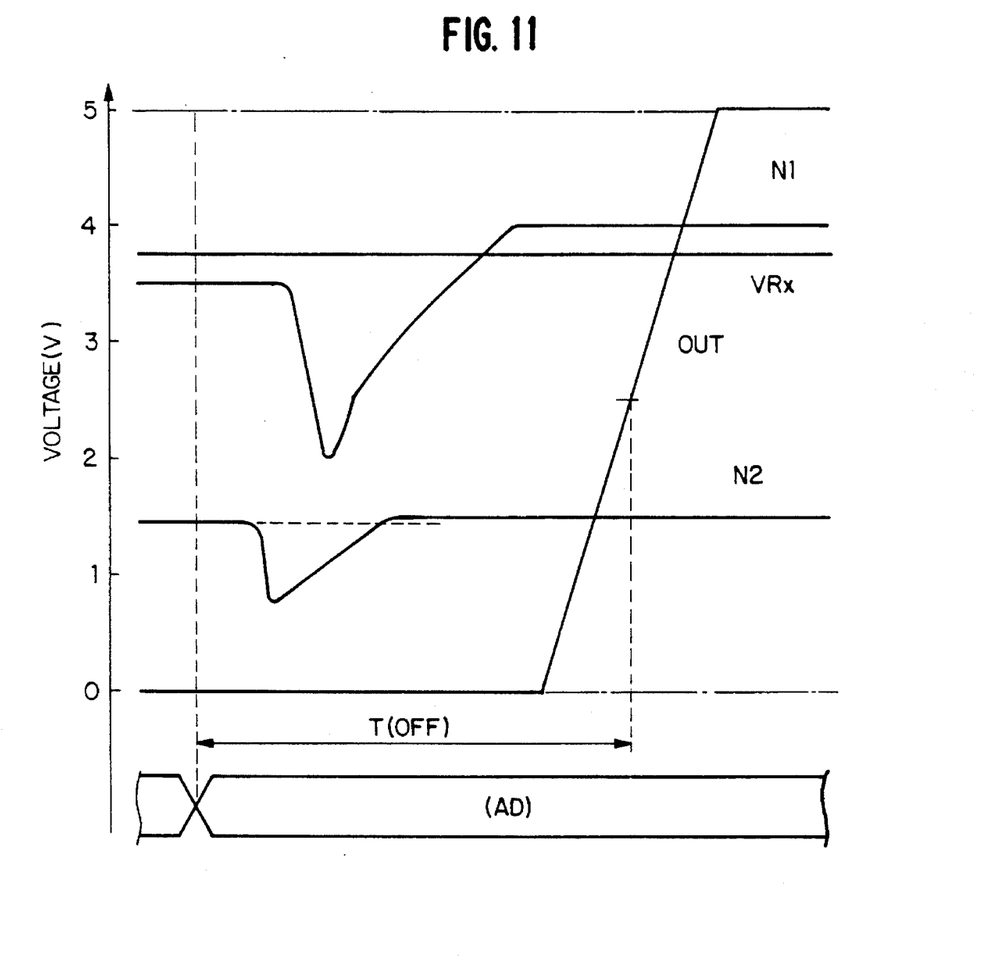
FIG. 11 is a waveform diagram used to explain the operation and problems of the device shown in FIG. 10.
Figure 12:
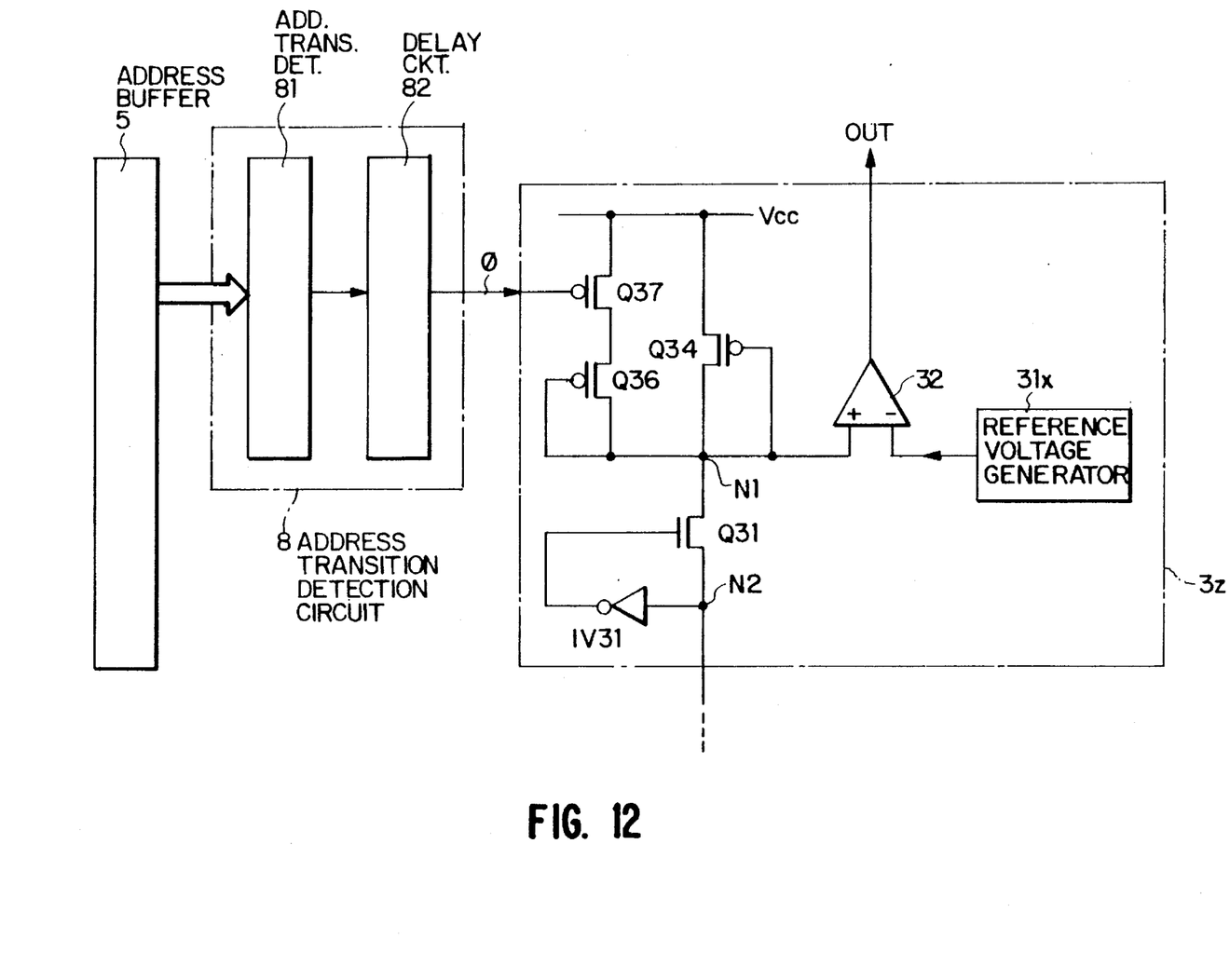
FIG. 12 is a block diagram showing a sense amplifier and peripheral circuits of still another conventional semiconductor memory device.

The advantages of transistor Q35 become more apparent from FIG. 11. Note that, as compared with FIG. 9, in FIG. 11 the voltage drop at node N1 after switching is 3.5 V−2 V=1.5 V and becomes small. This means that the digit line and the node N1 are charged at high speed by the operation of the transistor Q35. Consequently, it follows that T(OFF) has become high-speed. Turning now to FIG. 12, another sense amplifier and accompanying peripheral circuits are shown as a third example of the conventional semiconductor memory device. This sense amplifier 3z is different from the sense amplifier 3x shown in FIG. 6 in that, between node N1 and power supply potential Vcc, there is provided a P-channel transistor Q36 having its gate and drain connected to the node N1 and a precharge control P-channel transistor Q37 having its source connected to power supply line Vcc, its drain connected to the source of transistor Q36 and its gate supplied with a control signal φ is input. This signal φ is generated by an address transition detection circuit 8 is incorporated into the semiconductor memory device. The address transition detection circuit 8 includes an address transition detection section 81 and a delay circuit 82, and detects a change in the address value of the address signal AD transferred from the address buffer 5 and generates the control signal φ that goes to an active level for a specified period. This semiconductor memory device is disclosed, for example, in Japanese Patent Laid-open Publication No. SHO 57-50390.

The operation of the sense amplifier 3z of this device will be described below in conjunction with the waveform shown in FIG. 13.

If it is now assumed that the address is switched and the control signal φ goes to the active low level, the transistor Q37 is turned ON to render the precharge transistor Q36 conductive. The transistor Q36 has about ten times as large current drive capability as the transistor Q34 and thus quickly charges the node N1 up to a level of about ($V_{CC}-V_{TP}$) (=4 V) regardless of the storage information of the memory cell in the selected state. The control signal φ is thereafter changed to the high level to turn the transistor Q37 OFF. The transistor Q36 is also rendered non-conductive, consequently.

If, the memory cell in the selected stage is an off-bit, the node N1 remains ($V_{CC}-V_{TP}$) (=$V_{N1}$(OFF)). If, on the other hand, the memory cell in the selected state is an on-bit, node N1 is transferred and balanced to ($V_{CC}-V_{TP}-\alpha$) (=$VS_{N1}$(ON)).

Figure 13:
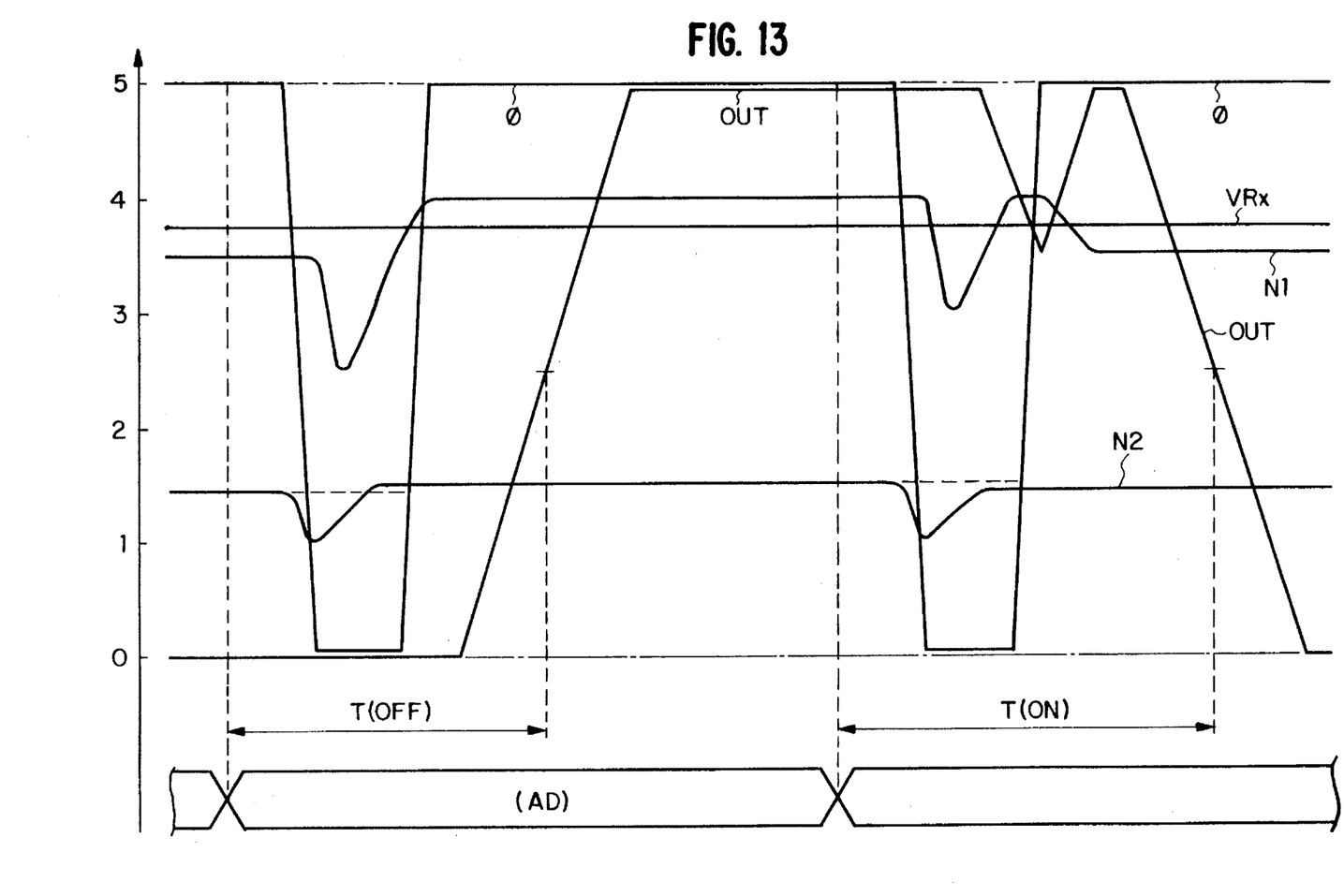
FIG. 13 is a waveform diagram used to explain the operation and problem of the device shown in FIG. 12.

Note that, in FIG. 13, the voltage drop on node N1 after the address is switched is 1 V. (For example, the voltage on node N1 drops from 3.5 V to 2.5 V). That is, this voltage drop is smaller than the voltage drop (1.5 V) at node N1 shown in the second example. This is because the transistor Q36 charges the node N1 more effectively, since the absolute value of the threshold value (1.0 V) of the transistor Q36 is lower than that (2.5 V) of the transistor Q35 (see FIG. 10). The voltage drop at node N2 can also be described in the same way.

Note that the threshold value of the transistor Q35 can be reduced to a small value by changing the manufacturing process thereof in order to cancel the back bias effect. However, in such a case, the threshold values (normally 1 V) of other N-channel enhancement-mode transistors, which constitute the peripheral circuits and are not subjected to a back bias, are also decreased. That is, it is impossible to change only the threshold value of the transistor Q35 without increasing the number of manufacturing steps.

Unless the number of manufacturing steps is increased, the transistor Q35, takes the enhanced threshold value of about 2.5 V. Therefore, the node N1 can be charged quickly up to 2.5 V, which is an intermediate point of the power supply potential, but, after 2.5 V, the node N1 cannot be charged quickly. The second example therefore has the disadvantages that high-speed operation cannot be attained after 2.5 V.

In the third example, since node N1 is precharged by means of P-channel transistor, it can be charged quickly up to a maximum level of 4 V. However, when the stored information of the memory cell is transferred to the differential amplifier 32, the precharge transistor Q37 is required to be non-conductive, the address transition detection circuit 8 is therefore needed to control the level of the control signal ϕ. The number of circuit elements and wiring layers is increased accordingly. The memory capacity is also lowered accordingly. Further, the voltage at the node N1 is charged to such a level that exceeds the reference voltage TRx, so that the number of the inversion operations of the differential amplifier 32 is increased at the on-bit selection time and therefore the amplifier 32 cannot operate with high reliability.

SUMMARY OF THE INVENTION

It is therefore an object of the present invention to provide a semiconductor memory device having an improved sense amplifier.

It is another object of the present invention to provide a semiconductor memory device which is capable of high-speed operation, high-density integration, and stable operation without increasing the number of manufacturing processes or design processes and also not increasing the number of circuit elements.

A semiconductor memory device according to the present invention comprises a memory cell array including a plurality of memory cells, a plurality of word lines and a plurality of digit lines, an inverting amplifier, a column selector selecting one of the digit lines in response to a column selection signal and coupling the selected digit line to the input node of the inverting amplifier, a first transistor of a first channel type having its source connected to the input mode of the inverting amplifier and its gate connected to the output mode of the inverting amplifier, a second transistor of a second channel type having its gate and drain connected to a drain of the first transistor and its source connected to a power supply line, an impedance element connected between the power supply line and the drain of the first transistor, and a sense circuit including a reference voltage generator generating a reference voltage and a comparator comparing the voltage of the drain of the first transistor with the reference voltage.

BRIEF DESCRIPTION OF THE DRAWINGS

The above and other objects, advantages and features of the present invention will become more apparent from the following detailed description taken in conjunction with the accompanying drawings, wherein.

DETAILED DESCRIPTION OF THE PREFERRED EMBODIMENTS

Figure 1:
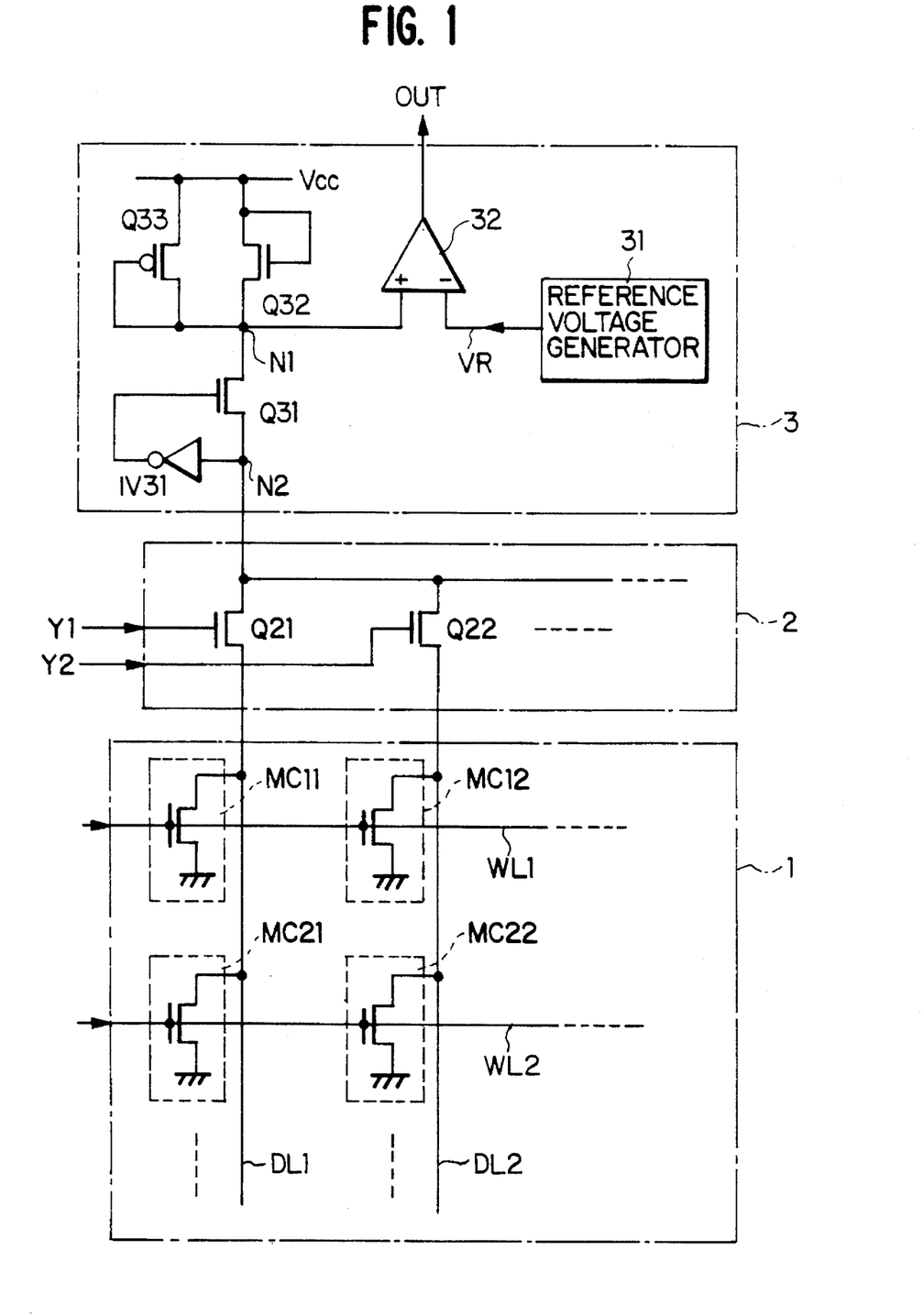
FIG. 1 is a circuit diagram illustrative of a part of a semiconductor memory device according to a first embodiment of the present invention.

Referring to FIG. 1, there is shown a part of a semiconductor memory device according to the first embodiment of the present invention, in which the same constituents as those shown in FIG. 6 are denoted by the same reference numerals.

In the present device, a sense amplifier 3 is featured. Specifically, an N-channel MOS transistor Q32 is employed as a load and a P-channel enhancement-mode transistor Q33 is employed as a precharge transistor. The transistor Q32 has its source connected to the node N1 and its gate and drain connected to the power supply line $V_{CC}$.

In this embodiment, the threshold voltage of the transistor Q32 is designed to be about 0 V. This threshold voltage is realized by the so-called non-doped type transistor. More specifically, the threshold voltage of the transistor is controlled by an impurity concentration of a channel region thereof, as well known in the art. In general, all the transistors are subject to a channel doping process in which impurities are doped into the channel region of each of the transistors. Each of N-channel MOS transistors is thereby controlled to have its threshold voltage of 1 V. Similarly, each of P-channel MOS transistors is controlled to have its threshold voltage of 1 V in absolute value. In this embodiment, the transistor Q32 is free from the channel doping process and thus has its threshold voltage of about 0 V. This is simply carried out only by changing a mask pattern layout for selectively doping impurities into the channel regions of the selected transistors. No increase in manufacturing steps therefore take place. Thus, the transistor Q32 has its threshold voltage lower than that of the remaining N-channel MOS transistors. Moreover, the threshold voltage of the non-doped type MOS transistor such as the transistor Q32 is only slightly affected by the back bias effect. For a typical example, the threshold voltage Q32 is changed from about 0 V to 0.3 V by the back bias effect.

The P-channel transistor Q33 has its source connected to the power supply line $V_{CC}$ and its gate and drain connected to the node N1 and is formed to have a threshold value almost equal to a threshold value of a normal P-channel enhancement-mode transistor. The transistor Q33 is further formed to have a current drive capability larger than that of transistor Q32.

Further in this embodiment, the reference voltage from the reference voltage generator 31 is designed to have a level of VR which will be described in detail later.

In this embodiment, when no current flows through the selected memory cell, the voltage $V_{N1}(OFF)$ at the node N1 is represented as follows by setting the threshold voltage of the transistor Q32 to $V_{TN0}$:

$$V_{N1}(OFF)=V_{CC}-V_{TN0} \tag{4}$$

Concretely, when threshold value $V_{TN0}$=0.3 V, $V_{N1}(OFF)$ becomes 5 V–0.3 V=4.7 V.

On the other hand, when the selected memory cell transistor is rendered conductive, since a current $I_{MC}$ flows through the selected memory cell and the transistor Q31, the voltage $V_{N1}(ON)$ at node N1 is expressed as follows:

$$V_{N1}(ON)=V_{CC}-V_{TN0}-\alpha \tag{5}$$

If α, as in the case of the prior art, is set to 0.5 V, $V_{N1}(ON)$=5 V–0.3 V–0.5 V=4.2 V.

Figure 2:
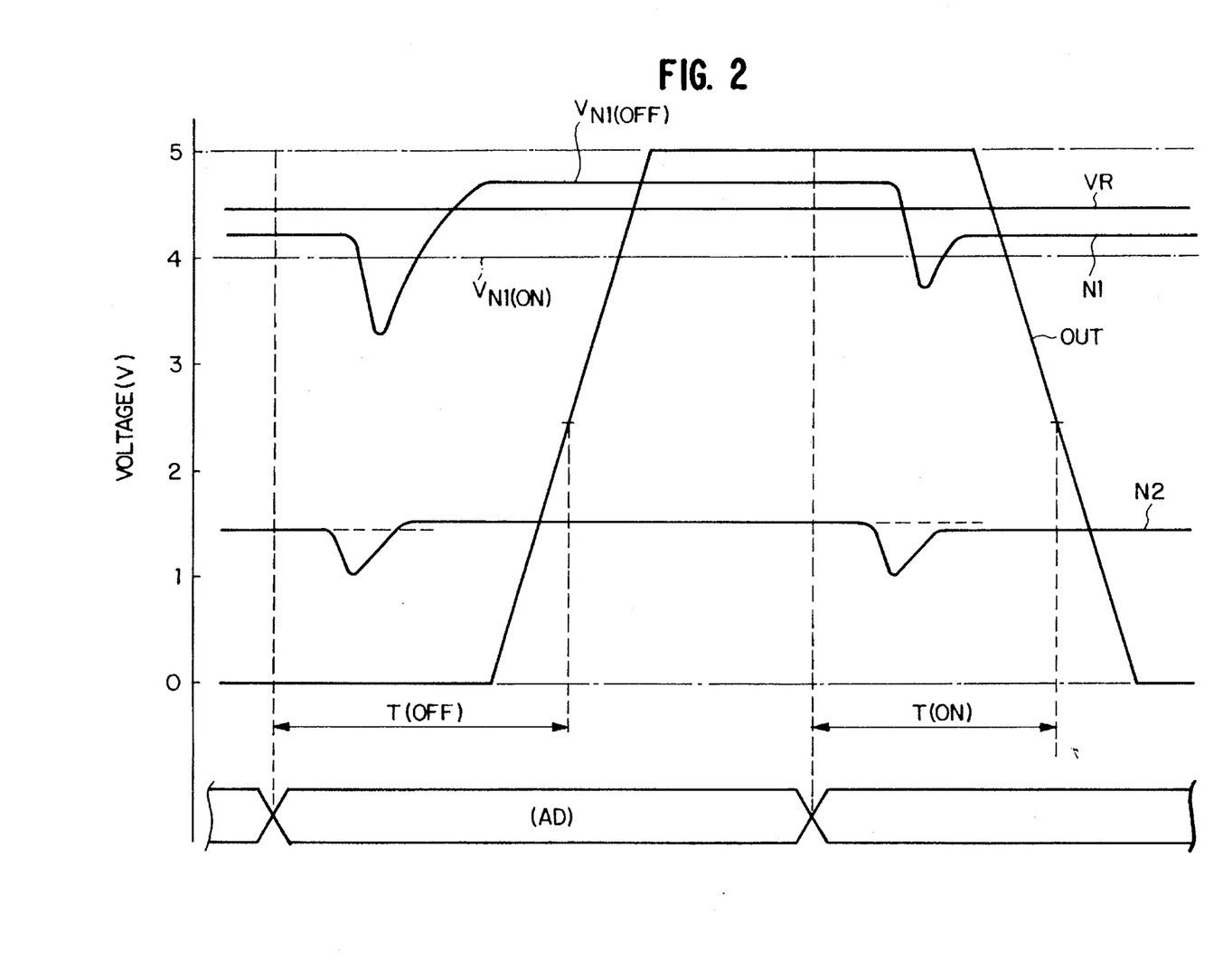
FIG. 2 is a waveform diagram indicating an operation of the device shown in FIG. 1.
Figure 3:
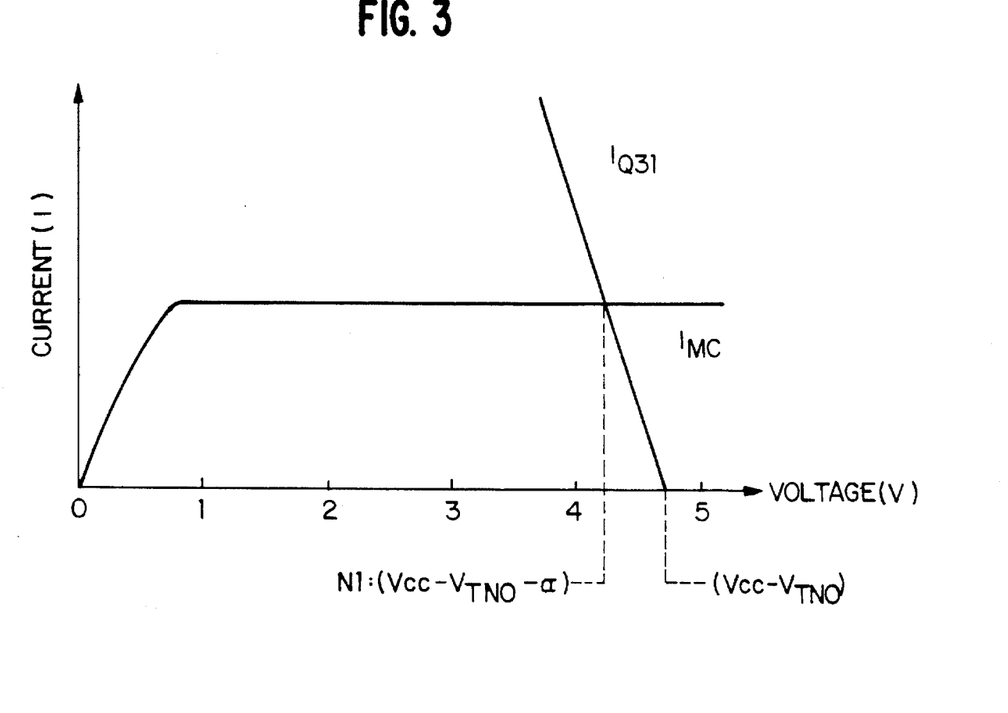
FIG. 3 is a current-voltage characteristic diagram used to explain the operation of the device shown in FIG. 1.

Next, the description will be made on an operation of the circuit shown in FIG. 1 with reference also to FIGS. 2 and 3.

After the switching of an address, the voltage at node N1 follows the voltage drop of the selected digit line that has been connected to the on-bit and thus drops.

Consequently, the voltage at node N1 becomes less than ($V_{CC}-V_{TP}$=4 V), so that the precharge transistor Q33 is turned ON to charge the node N1 up to ($V_{CC}-V_{TP}$). Since the transistor Q33 is set so as to have a large current drive capability about ten times as large as the load transistor Q32, the node N1 can be charged at high speed.

At the time node N1 has reached the level of ($V_{CC}-V_{TP}$), the transistor Q33 is rendered non-conductive. If a selected memory cell is the off-bit, the node N1 will be further charged and balanced to the voltage $V_{N1}(OFF)$ (=$V_{CC}-V_{TN0}$) by the transistor Q32.

If, on the other hand, a selected memory cell is the on-bit, the node N1 is in turn discharged and balanced to the voltage $V_{N1}(ON)$ (=$V_{CC}-V_{TN0}-\alpha$), as described above. As shown in FIG. 2, the voltage drop at node N1 after the switching of an address is 1 V, as in the case of FIG. 13, because operation of transistor Q36 used as a precharger and transistor Q36 is the same when electrically connected.

Thus, in this embodiment, if the voltage at the node N1 becomes less than ($V_{CC}-V_{TP}$=4 V), by the selected digit line to which the on-bit has been connected, it is charged up to the voltage (4 V), which is lower than 4.2 V of the on-bit selection time, by means of transistor Q33 whose current drive capability is large. Thereafter, by means of transistor Q32, the node N1 is charged up to ($V_{CC}-V_{TN0}$) (=4.7 V) at the off-bit selection time or discharged up to ($V_{CC}-V_{TN0}-$) (=4.2 V) at the on-bit selection time. Therefore, a high-speed operation is attained and unstable operation such as that shown in FIG. 13 is eliminated at the on-bit selection time. In addition, precharger transistor Q37 and a circuit for generating control signal φ of transistor Q37 become dispensable, and a reduction in the number of circuit elements and wires becomes possible.

The reference voltage generator 31 generates the reference voltage VR taking an intermediate level between the voltages $V_{N1}(OFF)$ and $V_{N1}(ON)$. Therefore, only when such a memory cell transistor MC that is rendered conductive in response to the selection level of the word line WL is selected, the differential amplifier 32 produces the high level output signal OUT.

Figure 4:
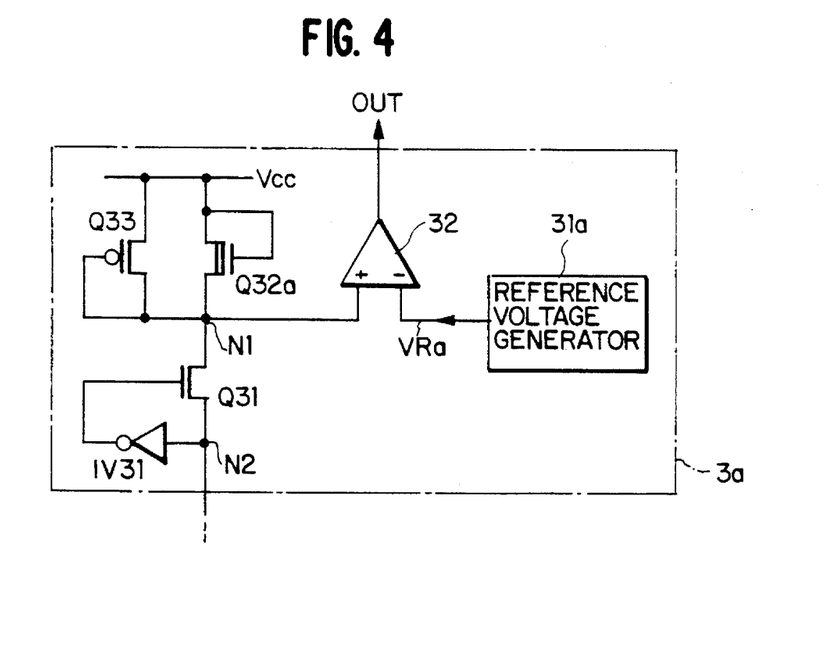
FIG. 4 is a circuit diagram showing a sense amplifier according to a second embodiment of the present invention.

Referring to FIG. 4, the sense amplifier 3a according to the second embodiment of the present invention employs a depletion-mode transistor Q32a in place of the enhancement-mode transistor Q32 shown in FIG. 1. In this embodiment, $V_{N1}(OFF)$ becomes $V_{CC}$=5 V. Therefore, $V_{N1}(ON)$ is $V_{CC}-\alpha$=5 V–0.5 V=4.5 V. A reference voltage VRa is set to VRa=($V_{N1}(OFF)+V_{N1}(ON)$)/2=(5 V+4.5 V)/2=4.75 V.

If desired, the gate of the transistor Q32a may be connected to the node N1. Note that the threshold value of the N-channel depletion-mode transistor is typically a negative value and about –5 V, for example. Further, a resistor may be employed instead of the transistors Q32 and Q32a.

It is apparent that the present invention is not limited to the above embodiments but may be modified and changed without departing from the spirit and scope of the present invention.

What is claimed is:

1. A semiconductor memory device comprising:
   a memory cell array including a plurality of memory cells, a plurality of word lines and a plurality of digit lines, each of said memory cells being coupled to one of said word lines and one of said digit lines;
   an inverting amplifier having an input node and an output node;
   a column selector selecting one of said digit lines in response to a column selection signal and coupling said one of said digit lines to the input node of said inverting amplifier;
   a first transistor of a first channel type connected between the input node of said inverting amplifier and a circuit node and having a gate connected to the output node of said inverting amplifier;
   a precharge transistor of a second channel type having a source coupled to a power supply line and a gate and a drain coupled to said circuit node, said first channel type being opposite to said second channel type;
   an impedance element coupled between said power supply line and said circuit node; and
   an amplifier having a first input end coupled to said circuit node and a second input end supplied with a reference voltage.

2. The semiconductor memory device as claimed in claim 1, wherein said impedance element comprises a third transistor which is an enhancement type and having a threshold voltage smaller than a threshold voltage of said first transistor, and a gate coupled to said power supply line.

3. The semiconductor memory device as claimed in claim 1, wherein said impedance element comprises a depletion type transistor having a gate coupled to said power supply line.

4. The semiconductor memory device as claimed in claim 1, wherein each of said memory cells comprises an insulated gate transistor which, by a read-out voltage supplied thereto, is rendered conductive or kept non-conductive in accordance with data stored therein, and said reference voltage has an intermediate level between a first level that is obtained at said circuit node when a memory cell being rendered conductive is coupled to said one of said digit lines and a second level that is obtained at said circuit node when a memory cell being kept non-conductive is coupled to said one of said digit lines.

5. A semiconductor memory comprising:

a sense node, a precharging transistor coupled between a power supply line and said sense node and precharging said sense node to a precharge level that is smaller than a power voltage on said power supply line by a threshold voltage of said precharging transistor, an impedance element coupled between said power supply line and said circuit node and changing said circuit node from said precharge level to a first voltage level that is larger than said precharge level when a memory cell storing one of a binary data is coupled to said circuit node and to a second voltage level that is smaller than said first voltage level when a memory cell storing the other of said binary data is coupled to said circuit node, a reference voltage generator generating a reference voltage that is intermediate between said first and second voltage levels, a comparator comparing a voltage level of said circuit node with said reference voltage, and a coupling circuit coupling said memory cell to said circuit node, said coupling circuit comprising a coupling transistor having a source-drain path connected between said circuit node and said memory cell and an inverter having an input node connected to said memory cell and an output node connected to a gate of said coupling transistor, said coupling transistor having a channel type opposite to a channel type of said precharge transistor, said impedance element comprising a load transistor of a channel type equal to the channel type of said coupling transistor and opposite to the channel type of said precharge transistor.

6. The memory device as claimed in claim 5, wherein said precharging transistor is of a P-channel type and has a source coupled to said power supply line and a gate and a drain coupled to said circuit node, and each of said coupling transistor and said load transistor is of an N-channel type.

7. The memory device as claimed in claim 6, wherein said load transistor is an N-channel transistor having a threshold voltage smaller in absolute value then a threshold voltage of said precharging transistor and a gate coupled to said power supply line.

8. The memory device as claimed in claim 6, wherein said load transistor is an N-channel depletion transistor.

9. The memory device as claimed in claim 1, wherein said first channel type is an N-channel type and said second channel type is a P-channel type.

* * * * *